United States Patent
Hutchison

[11] Patent Number: 5,969,583
[45] Date of Patent: Oct. 19, 1999

[54] COMMON-MODE EMI FILTER WITH A SEPARATELY WOUND GROUND WINDING

[75] Inventor: James B. Hutchison, Palo Alto, Calif.

[73] Assignee: Acuson Corporation, Mountain View, Calif.

[21] Appl. No.: 08/773,303

[22] Filed: Dec. 23, 1996

[51] Int. Cl.$^6$ ................................................. H03H 7/09
[52] U.S. Cl. ........................... 333/181; 333/185; 333/12
[58] Field of Search ...................... 333/181–185, 333/12

[56] References Cited

U.S. PATENT DOCUMENTS

| | | | |
|---|---|---|---|
| 3,212,004 | 10/1965 | Rumöller | 333/181 X |
| 4,259,705 | 3/1981 | Stifter | 333/12 X |
| 4,342,013 | 7/1982 | Kallman | 333/181 |
| 4,723,115 | 2/1988 | Apter | 333/181 |
| 4,761,623 | 8/1988 | Schneider | 333/167 |
| 5,313,176 | 5/1994 | Upadhyay | 333/181 |
| 5,461,351 | 10/1995 | Shusterman | 333/181 |
| 5,528,205 | 6/1996 | Wong | 333/177 |
| 5,536,978 | 7/1996 | Cooper et al. | 333/12 X |

FOREIGN PATENT DOCUMENTS

| | | | |
|---|---|---|---|
| 54-144851 | 11/1979 | Japan | 333/181 |
| 4-94205 | 3/1992 | Japan | 333/185 |

OTHER PUBLICATIONS

McPartland, editor, National Electrical Code Handbook, 16th ed., New York: McGraw–Hill, p. 289, 1993.

Almor Corporation, "Molded Cord & Cable Products" Brochure (1997).

*Primary Examiner*—Robert Pascal
*Assistant Examiner*—Justin P. Bettendorf
*Attorney, Agent, or Firm*—Morrison & Foerster

[57] ABSTRACT

An EMI filter and method of manufacturing thereof is described. The filter includes two or more power conductors and a ground conductor. The power conductors and the ground conductor are separately wound onto a core to form a common-mode choke. The filter may be located in an equipment chassis. Capacitors may be coupled to the choke to improve filter performance. The core may comprise at least two magnetic beads. The core material and number of turns of the conductors may be chose to control the frequency range of common-mode noise rejection. The frequency range may be that in which adequate common-mode noise rejection is achieved for a diagnostic ultrasound machine, e.g., approximately 0 to 20 MHz.

32 Claims, 3 Drawing Sheets

COMMON-MODE EMI FILTER WITH A SEPARATELY WOUND GROUND WINDING

BACKGROUND

Electronic instruments produce electronic or electromagnetic interference (EMI), which can interfere with the operation of other electronic instruments. EMI is often modeled as two superposed current components: common-mode current and differential-mode current. Differential-mode currents, by definition, travel in opposite directions on a pair (or multiplicity) of conductors. Commonmode currents are defined as traveling in the same direction on a pair (or multiplicity) of conductors.

Differential-mode noise travels in the same direction as the desired signal, e.g., the drive signal or power component. In contrast, common-mode noise is expressed as a displacement with respect to a reference potential on both (or a multiplicity of) conductors at the instrument location. If the instrument in question measures its signals with respect to a ground potential, common-mode noise may corrupt its measurement of the desired signal, as described below.

Rejection of all common-mode currents, i.e., noise, is desired. To do so, conventional EMI filters employ a common-mode choke on the hot and neutral conductors (or "lines") of a power cord. For safety purposes, the ground line from the wall outlet is connected to the chassis of the electronic equipment. The design of conventional EMI filters implicitly assumes that the ground or "protective earth" conductor is a low impedance means to which radio frequency noise may be diverted. In that regard, the existing body of EMI regulations teaches that the "third conductor" ("ground") is "datum" or zero volts at all frequencies. This is not the case, especially for frequencies in the passband of machines such as diagnostic ultrasound equipment.

When measured at frequencies greater than 100 KHz, the power line is not at earth-ground potential at the point of use. In fact, the ground conductor, as well as the power conductors, exhibit high impedance with respect to EMI impressed by other sources, and also form an excellent antenna for radiated signals in the RF band. Two mechanisms are responsible for this phenomenon. First, the ground conductor in the distribution system exhibits inductive series impedance as a function of its length. This impedance may be in the hundreds of ohms for frequencies of 1 MHz and higher. Second, noise is capacitively coupled from the power conductors (hot and neutral) to the ground conductor along the length of the power run. In addition, other equipment connected to the same power distribution system may inject noise into the ground conductor by virtue of the design of their EMI filters.

Ground conductor noise can have significant effects on sensitive equipment, such as ultrasound machines. The chassis of the ultrasound machine typically is connected to the ground conductor of the wall outlet. An extremely sensitive (1–10 nanovolt) ultrasound transducer array operating in the 0–20 MHz range is connected to the chassis through a shielded cable. The cable shielding is connected to the chassis ground, whereas the center conductors are connected to the transducer array elements. The noise voltage on the chassis ground is experienced at the transducer cable shielding and coupled by mutual inductance to the transducer element conductors. This results in noise on the desired ultrasound signal.

Such power line noise at the point of use has been found on the ground conductor in substantially the same amount as on the power conductors. However, conventional EMI filters in Class I equipment (grounded metallic chassis) connect the ground connector directly to the chassis or other grounded metal. This practice, as described above, impresses the noise from the ground conductor directly onto the chassis and negates any beneficial effect derived from the common-mode choke, which is typically in series only with the power conductors.

In an attempt to address this problem, some EMI filters incorporate a discrete inductor in series with the ground conductor between the equipment chassis and the equipment's connection to the ground line running from the wall outlet. Although this inductor mitigates the above problem, it actually can detract from the performance of the EMI filter in other modes because it inserts a high impedance in series with the ground conductor. First, noise may be present on the power conductors but not the ground conductor. In that case, the additional inductor reduces the effectiveness of the Y-capacitors (typically inserted between ground and each of the hot and neutral power conductors) by inserting an impedance in series with the ground conductor, thereby increasing the susceptibility of the equipment to noise. Second, the additional inductor can increase noise emissions on the power line wires, again because it reduces the effectiveness of the Y-capacitors by isolating them from the ground conductor.

To improve common-mode noise rejection on the ground line, some manufacturers, such as Almor Corporation, include a common-mode choke in the power cord. These chokes include a ferrite bead onto which one to four turns of a multiconductor power cord are wound.

Such in-line EMI filters are bulky and limited in performance. The large, heavy in-line core that is wound with a multiconductor cable is typically placed near the power plug, resulting in a tendency to pull the plug out of the wall socket due to its weight. If greater noise rejection were desired, then a higher impedance, and, thus, a greater number of turns would be necessary. This causes even more weight on the power cord. Moreover, if capacitors were used in conjunction with the in-line choke to improve performance, this addition would also increase size and weight. Further, although the in-line EMI filter achieves some common-mode noise rejection, the proximity of the hot, neutral and ground wires to each other causes mutual capacitance among those wires that prevents the filter from realizing its optimum common-mode noise rejection. Because the wires are wound in a trifilar fashion, the coupling coefficient K is nearly equal to 1, resulting in essentially no differential noise rejection.

Accordingly, it is desired to provide an improved EMI filter that achieves common-mode noise rejection without these limitations.

SUMMARY OF THE INVENTION

The present invention provides an EMI filter and method of manufacturing same. The filter includes two or more power conductors and a ground conductor. The power conductors and the ground conductor are separately wound onto a core to form a common-mode choke. The filter may be located in an equipment chassis. Capacitors may be coupled to the choke to improve filter performance. The core may comprise at least two magnetic beads. The core material and number of turns of the conductors may be chosen to control the frequency range of common-mode noise rejection. The frequency range may be that in which adequate common-mode noise rejection is achieved for a diagnostic ultrasound machine, e.g., approximately 0 to 20 MHz.

DETAILED DESCRIPTION OF THE INVENTION

The present invention provides an improved EMI filter for common-mode noise rejection. In the following description, numerous details are set forth in order to enable a thorough understanding of the present invention. However, it will be understood by those of ordinary skill in the art that these specific details may not be required in order to practice the invention. Further, well-known elements, device components, process steps and the like may not be set forth in detail in order to avoid obscuring the present invention.

Figure 1:
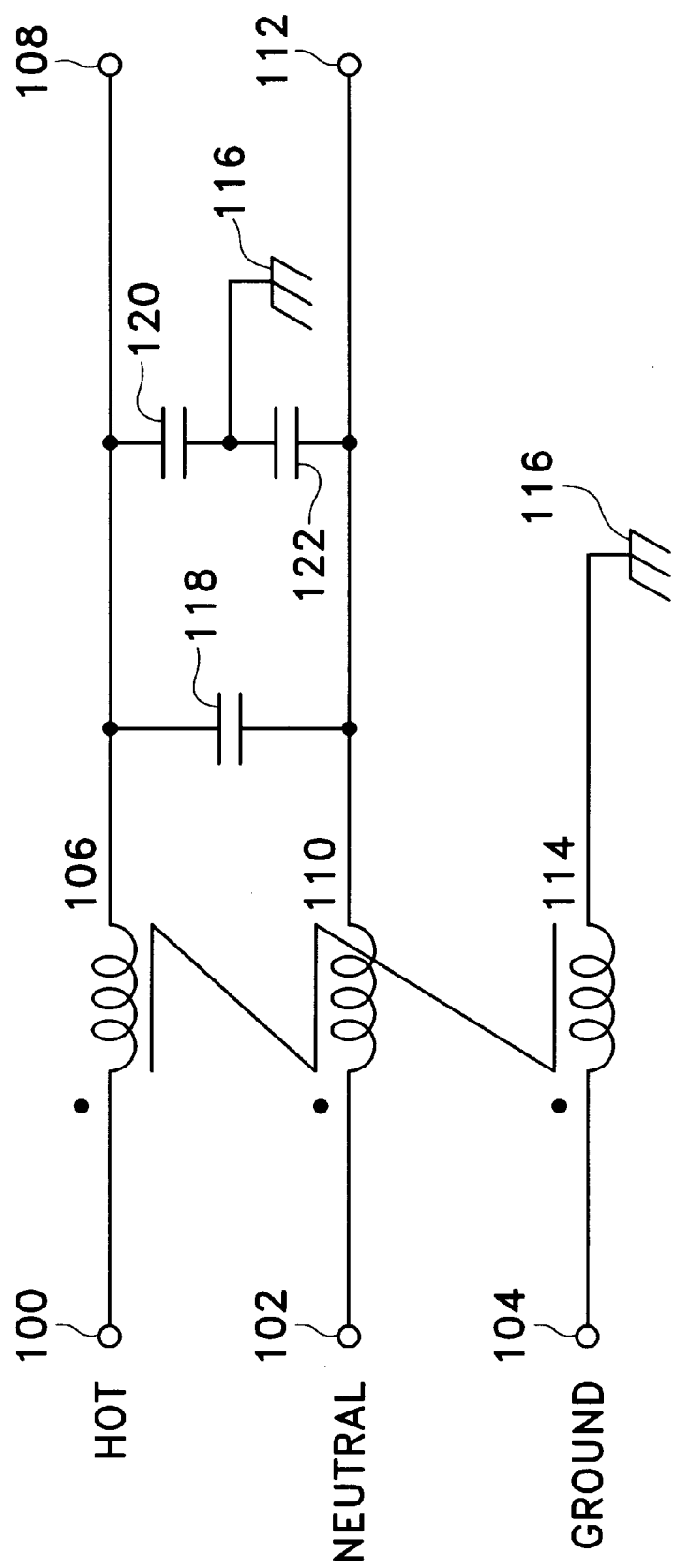
FIG. 1 is a circuit diagram illustrating a single-phase common-mode noise filter the present invention.

FIG. 1 is a circuit diagram illustrating a single-phase common-mode filter of the present invention. The choke includes hot, neutral and ground inputs 100, 102, 104, respectively, that connect to corresponding hot, neutral and ground wires (not shown) that deliver power to an electronic device, such as an ultrasound machine. The inputs typically are mounted in a socket on a panel of the machine chassis. The hot input 100 is connected to a first inductor 106, the other side of which is connected to a first filter output 108. The neutral input 102 is coupled to a second inductor 1 10, the other side of which is coupled to a second filter output 112. The ground input 104 is coupled to a third inductor 114, the other side of which is coupled to chassis ground 116. The first and second filter outputs 108 and 112 are coupled to each other by a first "X" capacitor 118. The first capacitor 118 helps reduce differential noise directly by presenting a low impedance (at high frequency) across the hot and neutral lines 108 and 112.

The first filter output 108 is coupled to chassis ground 116 through a second "Y" capacitor 120. The second filter output 112 is coupled to chassis ground 116 through a third "Y" capacitor 122. The Y capacitors 120 and 122 reduce common-mode noise on the hot and neutral lines 108 and 112 with respect to ground. Typically, the values of the capacitors 120 and 122 are constrained to maximum values (and hence minimum impedances) by regulations governing chassis leakage current, e.g., 2.2 nanofarads for electromedical equipment and 22 nanofarads for commercial equipment, such as personal computers. These relatively low maximum capacitance values cause a relatively high impedance to appear across the Y capacitors 120 and 122. However, the Y capacitors 120 and 122 form the lower leg of a voltage divider having an upper leg comprising the common-mode choke around the hot and neutral lines 108 and 112. The impedance of this choke lowers the common-mode noise voltage across the Y capacitors 120 and 122 through the divider effect, thereby reducing common-mode noise at the filter output.

In one embodiment, the value of the capacitor 118 ranges approximately from 1 nanofarad to 0.2 microfarads, e.g, 4.7 nanofarads, and the capacitors 120 and 122 may take on values of 330 picofarads each. Those skilled in the art will recognize that capacitors may take on any appropriate values and be arranged in different topologies in an EMI filter incorporating the choke of the invention.

Figures 2A, 2B:
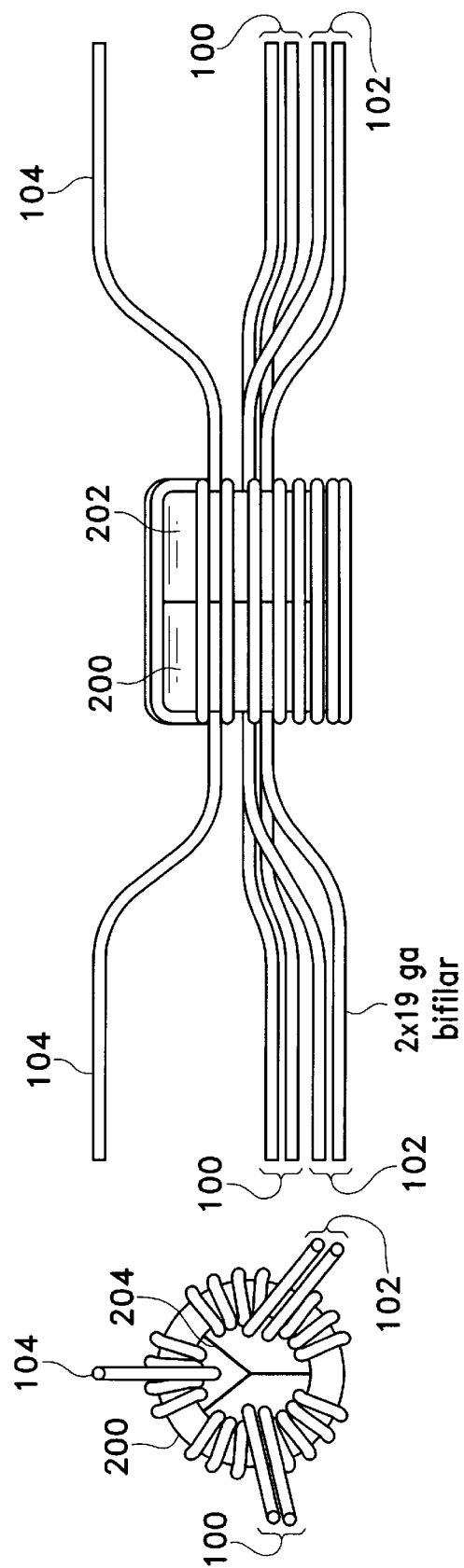
FIGS. 2A and 2B are front and side views, respectively, of the singlehase common-mode noise filter of the present invention.

FIGS. 2A and 2B are front and side views, respectively, of the common-mode filter of the present invention. As shown, the choke comprises two cylindrical ferrite beads 200 and 202 joined together by, e.g., adhesive tape (not shown). The beads have different magnetic permeabilities in order to control the impedance versus frequency characteristic of the choke, as described below.

The hot conductor 100, the neutral conductor 102 and the ground conductor 104 are separately wound around the bead core. The hot and neutral conductors may be bifilar in order to improve current carrying capacity, but need not be. All wires are insulated, but nevertheless separated by an inner insulating shield 204 for added insulation protection. Each conductor, in this example, is wrapped around the core four times.

By winding the ground conductor onto the common-mode choke, the common-mode noise on the ground line experiences the impedance of the choke along with the hot and neutral conductors. The resulting voltage drop across this impedance reduces the amount of noise from the ground conductor that is impressed upon the equipment chassis. Further, because the ground inductance is common-mode in equal measure to the power line inductance, it ameliorates the above-described problems encountered when only a discrete inductor is placed in series with the ground line. This structure forces external noise currents to which the device is susceptible, as well as emissions from the product, to be common-mode in equal measure on all three wires. These currents are then reduced by the common-mode impedance of the same choke.

The choke of the invention exhibits advantages over the prior art because the hot, neutral and ground conductors are wound separately around the choke rather than together in a trifilar fashion. Because the individual conductors are separately wrapped around the core, the mutual capacitance among the conductors is reduced. This reduced capacitance improves the common-mode rejection of the choke. Further, because the windings of the conductors are circumferentially separated around the core, the inductive coupling coefficient (K) between the windings is reduced from an ideal value of 1. This results in the inductor presenting differential impedance, in addition to common-mode impedance, thereby attenuating differential-mode noise as well.

Further, the choke of the invention is preferably placed inside the equipment chassis. This allows an arbitrary number of turns to be wound on the core (within chassis size constraints). These size constraints can be much looser than those for in-line chokes because the in-chassis choke does not weigh down the power cord or create a bulky lump on the cord. Further, for similar reasons, capacitors and other components can be added to the in-chassis choke to improve filter performance. Such components would also increase the bulk of an in-line filter.

The combination of core materials and number of turns may be selected to achieve a predetermined common-mode noise rejection over a desired frequency range. For example, a predetermined rejection (as a function of choke impedance) over the operating frequencies of a typical diagnostic ultrasound machine may be achieved as follows. The dual core may be formed of two ferrite beads such as the Steward 28B0870-100 and the Magnetics, Inc. ZW-42212-TC. With each line wrapped around the core four times, the magnitude of the impedance of the choke ranges from approximately 200 ohms to 1,000 ohms in the 100 KHz-20 MHz frequency range. If only the high-frequency (Steward) bead, which has a low permeability but high-frequency characteristic, were used, then an adequate impedance would be achieved at the higher end of the frequency range, but not at the lower end. Conversely, if only the low-frequency (Magnetics, Inc.) bead, which has a relatively high permeability, were used, then an adequate impedance would be achieved at the lower frequencies, but impedance would drop off at higher frequencies because higher permeability materials experience a reduction in permeability at lower frequencies when compared to low-permeability materials. By employing both beads stacked together, the impedances associated with the effects of the two beads are additive at each frequency, thereby resulting in a flatter and higher impedance versus frequency characteristic over a wider frequency range of interest. Note that a desired impedance vs. frequency characteristic may be achieved by selecting the core material and number of turns using standard impedance equations as a starting point, and then finely varying the number of turns until the desired characteristic is more closely achieved empirically as observed on an impedance analyzer or network analyzer.

Figure 3:
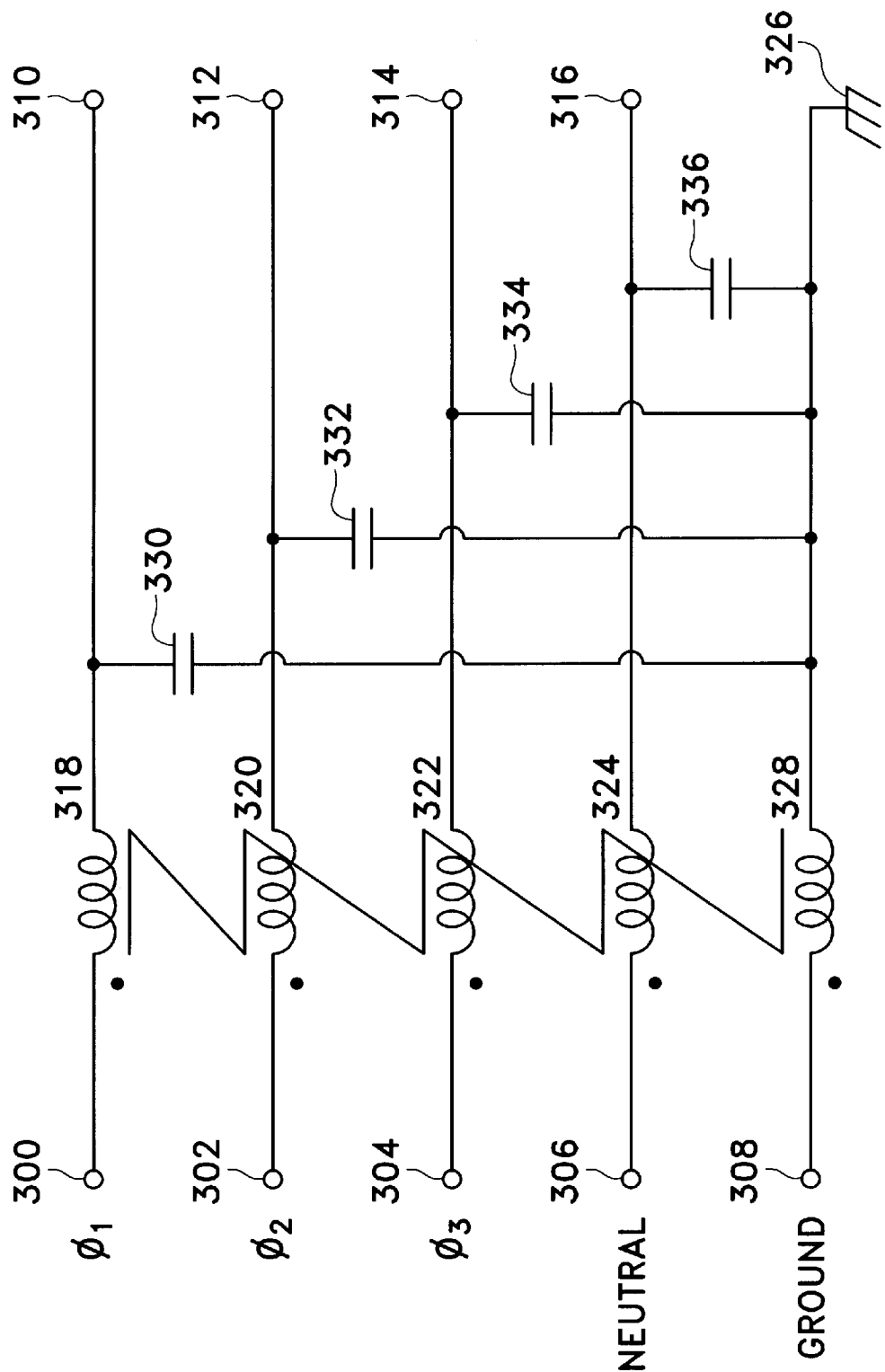
FIG. 3 is circuit diagram of a three-phase common-mode noise filter of the present invention.

FIG. 3 illustrates a circuit diagram for a three-phase common-mode filter of the present invention. Phase 1, phase 2, phase 3 and neutral inputs 300, 302, 304 and 306, respectively, receive corresponding power lines (not shown) from a power source, whereas a ground input 308 is connected to ground (not shown) from the power source. The phase 1, phase 2 and phase 3 inputs are coupled to first, second and third filter outputs 310, 312, 314, respectively, through respective first, second and third inductors 318, 320, 322. The neutral input 306 is coupled to a fourth filter output 316 through a fourth inductor 324. The ground input 308 is coupled to chassis ground 326 through a fifth inductor 328. All inductors 318, 320, 322, 324, 328 are common-mode on the same set of inductive cores. The first, second, third and fourth filter outputs 310, 312, 314, 316 are coupled through first, second, third and fourth capacitors 330, 332, 334, 336, respectively, to chassis ground 326. The first through fifth inductors are individually wrapped around the core in a manner similar to that employed in the single-phase common-mode choke. Note that regardless of the number of inductors wound on the core, the common-mode impedance remains the same, as can be derived by those skilled in the art.

By wrapping the ground wire around the choke along with the three-phase power lines, the ground conductor experiences the impedance of the choke in equal measure as the other conductors. This reduces the amount of noise from the ground conductor that is impressed on the equipment chassis in a manner like that achieved by the single-phase choke.

The foregoing demonstrates that the common-mode choke of the present invention achieves common-mode noise reduction on the ground line as well as on the other power lines, and, when used in-chassis, does not suffer from the size constraints of in-line chokes. Moreover, the choke of the invention achieves significant differential-mode noise rejection as well by virtue of the fact that the coupling coefficient K between the separate windings is less than 1.

Although the invention has been described in conjunction with specific embodiments, it will be appreciated that various modifications and alterations may be made by those skilled in the art without departing from the spirit and scope of the invention. In particular, those skilled in the art will recognize that the choke of the invention is not limited to four turns, but may employ any number of turns as long as a core of adequate size is used. For example, 10 to 12 turns for each conductor would achieve higher noise rejection in the 0-20 MHz frequency range, although such a choke would occupy a larger volume.

In addition, the beads forming the core need not be ferrite, but may be any other adequate magnetic material. Of course, not only two beads, but one, three or more beads may be used in the choke of the present invention depending upon the impedance versus frequency profile that is desired. Further, those skilled in the art will recognize that the choke of the invention may be implemented using a wide variety of core styles, such as E-I and E-E, as long as each winding (e.g., H, N, G) experiences the same impedance and stray capacitance. Winding chokes to achieve the latter two characteristics can be easily achieved by those skilled in the art.

What is claimed is:

1. An EMI filter comprising:
   at least two power conductors, wherein each power conductor has an input for electrical coupling to a power outlet, and each power conductor has an output;
   a ground conductor;
   a core onto which the at least two power conductors and ground conductor are separately wound to form windings of a common-mode choke, when the windings of the ground conductor are circumferentially separated around the core from the windings of the at least two power conductors, the outputs of the power conductors for providing a power signal with reduced common-mode noise.

2. The filter of claim 1, wherein the filter is located in an equipment chassis.

3. The filter of claim 1, further comprising capacitors coupled to the choke to improve filter performance.

4. The filter of claim 1, wherein the core comprises at least two magnetic materials of differing magnetic properties.

5. The filter of claim 1, wherein the core material and number of turns of the conductors are chosen to control the frequency range of common-mode noise rejection.

6. The filter of claim 5, wherein the core material and the number of turns are chosen to achieve common-mode noise rejection in a baseband receive frequency range of a diagnostic ultrasound machine.

7. The filter of claim 5, wherein the frequency range is approximately 0 to 20 MHz.

8. The filter of claim 1, wherein each power conductor corresponds to a phase.

9. The filter of claim 8 comprising three power conductors corresponding to three phases.

10. An EMI filter comprising:
    at least two power conductors;
    a ground conductor;
    a core onto which the at least two power conductors and the ground conductor are wound to form windings of a common-mode choke, wherein the core includes at least two magnetic materials of differing magnetic properties, and the windings of the ground conductor are circumferentially separated around the core from the windings of the at least two power conductors.

11. The filter of claim, 10 further comprising capacitors coupled to the choke to improve filter performance.

12. The filter of claim 10, wherein the core material and number of turns of the conductors are chosen to control the frequency range of common-mode noise rejection.

13. The filter of claim 12, wherein the core material and the number of turns are chosen to achieve common-mode noise rejection in a baseband receive frequency range of a diagnostic ultrasound machine.

14. The filter of claim 12, wherein the frequency range is approximately 0 to 20 MHz.

15. The filter of claim 10, wherein each magnetic material is in the form of a magnetic bead.

16. The filter of claim 10, wherein the filter is located in an equipment chassis.

17. The filter of claim 10, wherein each power conductor corresponds to a phase.

18. The filter of claim 17 comprising three power conductors corresponding to three phases.

19. A method for manufacturing an EMI filter, comprising the steps of:

providing a magnetic core;

providing at least two power conductors, wherein each power conductor has an input for electrical coupling to a power outlet and each power conductor has an output; and winding at least two power conductors and a ground conductor separately onto the core to form windings of a common-mode choke, so that the windings of the ground conductor are circumferentially separated around the core from the windings of the at least two power conductors, the outputs of the power conductors for providing a power signal with reduced common-mode noise.

20. The method of claim 19, further comprising the step of coupling capacitors to the choke to improve filter performance.

21. The method of claim 19, the providing step comprising the step of forming the core from at least two magnetic materials of differing magnetic properties.

22. The method of claim 19, further comprising the step of selecting the core material and number of turns of the conductors to control the frequency range of common-mode noise rejection.

23. The method of claim 22, the selecting step comprising the step of selecting the core material and the number of turns to achieve common-mode noise rejection in a baseband receive frequency range of a diagnostic ultrasound machine.

24. The method of claim 23, the selecting step comprising the step of selecting the core material and the number of turns to achieve common-mode rejection in a frequency range of approximately 0 to 20 MHz.

25. The method of claim 19, further comprising the step of placing the filter in an equipment chassis.

26. The method of claim 19, wherein each power conductor corresponds to a phase.

27. The method of claim 26, the at least two power conductors comprising three power conductors corresponding to three phases.

28. An EMI filter comprising:

at least two power conductors;

a ground conductor;

a core onto which the at least two power conductors and the ground conductor are wound to form windings of a common-mode choke, wherein the core material and number of turns of the conductors are chosen to control the frequency range of common-mode noise rejection, and the windings of the ground conductor are circumferentially separated around the core from the windings of the at least two power conductors.

29. The filter of claim 28, wherein each power conductor corresponds to a phase.

30. The filter of claim 29 comprising three power conductors corresponding to three phases.

31. The EMI filter of claim 28, wherein the core and the number of turns are chosen to achieve noise rejection over a baseband receive frequency range of a diagnostic ultrasound machine.

32. The EMI filter of claim 28, wherein the frequency range is approximately 0 to 20 MHz.

* * * * *

UNITED STATES PATENT AND TRADEMARK OFFICE
CERTIFICATE OF CORRECTION

PATENT NO. : 5,969,583
DATED : October 19, 1999
INVENTOR(S) : James B. Hutchison It is certified that error appears in the above-identified patent and that said Letters Patent is hereby corrected as shown below:

<u>Column 6,</u>
Line 20, change "when" to -- wherein --.

Signed and Sealed this

Eighteenth Day of September, 2001

*Attest:*

*Attesting Officer*

NICHOLAS P. GODICI
*Acting Director of the United States Patent and Trademark Office*